(12) United States Patent
D'Aquino et al.

(10) Patent No.: US 10,778,212 B1
(45) Date of Patent: Sep. 15, 2020

(54) VARIABLE IMPEDANCE SWITCHING CONTROL

(71) Applicant: Analog Devices, Inc., Norwood, MA (US)

(72) Inventors: Stefano I. D'Aquino, Westford, MA (US); Edward L. Collins, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/562,334

(22) Filed: Sep. 5, 2019

(51) Int. Cl.
  *H03H 19/00* (2006.01)
  *H03K 17/16* (2006.01)
  *G01R 31/28* (2006.01)

(52) U.S. Cl.
  CPC ....... *H03K 17/162* (2013.01); *G01R 31/2834* (2013.01)

(58) Field of Classification Search
  CPC .......................... H03K 17/162; G01R 31/2834
  See application file for complete search history.

(56) References Cited

U.S. PATENT DOCUMENTS

| | | | |
|---|---|---|---|
| 4,605,894 A | 8/1986 | Cox et al. | |
| 5,716,381 A * | 2/1998 | Reggiardo | ........... A61N 1/3937 607/5 |
| 7,295,033 B2 | 11/2007 | Chung et al. | |
| 7,518,320 B2 * | 4/2009 | Chen | ...................... H05B 45/10 315/291 |
| 8,610,458 B2 * | 12/2013 | Lee | .................... H03K 19/0005 326/30 |
| 9,365,173 B2 * | 6/2016 | Mackel | ................... B60R 16/03 |
| 2004/0100309 A1 | 5/2004 | Best et al. | |
| 2007/0069755 A1 | 3/2007 | Sartschev | |

* cited by examiner

*Primary Examiner* — Dinh T Le
(74) *Attorney, Agent, or Firm* — Schwegman Lundberg & Woessner, P.A.

(57) ABSTRACT

A system and method for controlling current-range switching to limit glitching includes a sense array connected between an input and a load. The sense array includes a parallel first and second branch circuits. The first branch circuit includes at least one first transistor, a first sense resistor, and a variable impedance control circuit. The variable impedance control circuit is configured to receive a control signal and generate a gate voltage of the at least one first transistor to establish an impedance of the sense array between the input and the load that is proportional to the control signal, including controlling the gate voltage of the at least one first transistor such that an impedance of the sense array transitions from a first value to a second value when connecting or disconnecting the first branch circuit between the input and the load while the input is connected to the load through the second branch circuit.

20 Claims, 7 Drawing Sheets

US 10,778,212 B1

VARIABLE IMPEDANCE SWITCHING CONTROL

TECHNICAL FIELD

This document pertains generally, but not by way of limitation, to switching control and particularly but not by way of limitation to variable impedance switching control to reduce voltage glitching.

BACKGROUND

Automated test equipment (ATE) systems may be configured to provide several different values of current to a device under test (DUT), for example. One method of accommodating various values of current is through an array of current sense resistors and associated switches. When switching between branches of the current sense array, a make-before-break approach may be employed. When closing a switch or opening a switch to transition between branches of the current sense array, a voltage glitch may be generated at the output to the DUT.

SUMMARY

It is desirable to limit the magnitude of voltage glitching when switching between branches of the sense arrays for automated test equipment (ATE) or other systems. In conventional ATE systems, for example, the ATE system may include a 100 uA range and a 1 mA range. With the 100 uA range closed and the 1 ma range open, the system may include a full-scale DUT current of 100 uA, and a 200 mV drop across the sense array. Closing the 1 mA switch (make-before-break switching) may decrease the voltage drop across the sense array from 200 mV to about 20 mV, since the 1 mA current range impedance (switch plus sense resistor) may be about 1/10 that of the 100 uA current range impedance, for example. Therefore, a 180 mV glitch may appear at the DUT, before the ATE loop is able to respond and settle to the original output voltage value. It is desirable to reduce the magnitude of this glitch.

The present inventors have realized, among other things, that using a variable impedance control circuit to control gate voltages of transistors for branch circuits being turned on or off to linearly control the impedance of the sense array based on a control signal, the magnitude of the glitch generated at the output to the DUT can be limited. In one example, method of controlling current-range switching to limit glitching when switching between different current ranges includes controlling at least one first transistor of a first branch circuit of a sense array to connect an input of the sense array to a load through the first branch circuit; varying a control signal to generate a gate voltage of at least one second transistor of a second branch circuit of the sense array to establish an impedance of the sense array between the input and the load that is proportional to the control signal, including controlling the gate voltage of the at least one second transistor such that an impedance of the sense array decreases from a first value to a second value when connecting the load to the input through the second branch circuit, wherein the second branch circuit is connected in parallel with the first branch circuit; and controlling the at least one first transistor of the first branch circuit of the sense array to disconnect the input from the load through the first branch circuit after the impedance of the sense array has reached the second value.

In another example, a method of controlling current-range switching to limit glitching when switching between different current ranges includes controlling at least one first transistor of a first branch circuit of a sense array to connect an input of the sense array to a load through the first branch circuit; controlling at least one second transistor of a second branch circuit of the sense array to connect the input to the load through the second branch circuit; and varying a control signal to generate a gate voltage of the at least one first transistor of the first branch circuit to establish an impedance of the sense array between the input and the load that is proportional to the control signal, including controlling the gate voltage of the at least one first transistor such that an impedance of the sense array increases from a first value to a second value when disconnecting the input from the load through first branch circuit.

In another example, a system for controlling current-range switching to limit glitching includes a sense array connected between an input and a load. The sense array includes a first branch circuit connected between the input and the load, and a second branch circuit connected between the input and the load and in parallel with the first branch circuit. The first branch circuit includes at least one first transistor, a first sense resistor, and a variable impedance control circuit. The variable impedance control circuit is configured to receive a control signal and generate a gate voltage of the at least one first transistor to establish an impedance of the sense array between the input and the load that is proportional to the control signal, including controlling the gate voltage of the at least one first transistor such that an impedance of the sense array transitions from a first value to a second value when connecting or disconnecting the first branch circuit between the input and the load while the input is connected to the load through the second branch circuit.

Each of these non-limiting examples or aspects can stand on its own, or can be combined in various permutations or combinations with one or more other examples or aspects. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A switching circuit is disclosed herein that utilizes a variable impedance control circuit to control a gate voltage of one or more transistors during turn-on and/or turn-off of a sense array branch circuit to control an impedance of the sense array when switching between branch circuits. Systems, such as automated test equipment (ATE) systems, may include sense arrays that include several branch circuits. Each branch circuit may include a sense resistor and an associated switch, for example. The ATE system may include a servo loop to control a voltage and current provided to a device-under-test (DUT), while the sense array can be controlled to accommodate a desired current range for the DUT. In conventional systems, when switching between branch circuits, relatively large voltage glitches may be seen on the output provided to the DUT due to closing and/or opening of the switches being much faster than the control loop.

To limit voltage glitching at the output to the DUT, the switches of a respective branch circuit may be controlled to gradually increase or decrease the impedance of the sense array. To accomplish this, a variable impedance control circuit can be used to control a gate voltage of the switches to control the impedance of the branch circuit being switched into such that the impedance of the sense array changes at a rate more closely matched to the speed of the control loop. This way, the change in voltage at the output to the DUT is not too fast for the servo loop, greatly reducing the voltage glitch seen on the output to the DUT.

Figure 1:
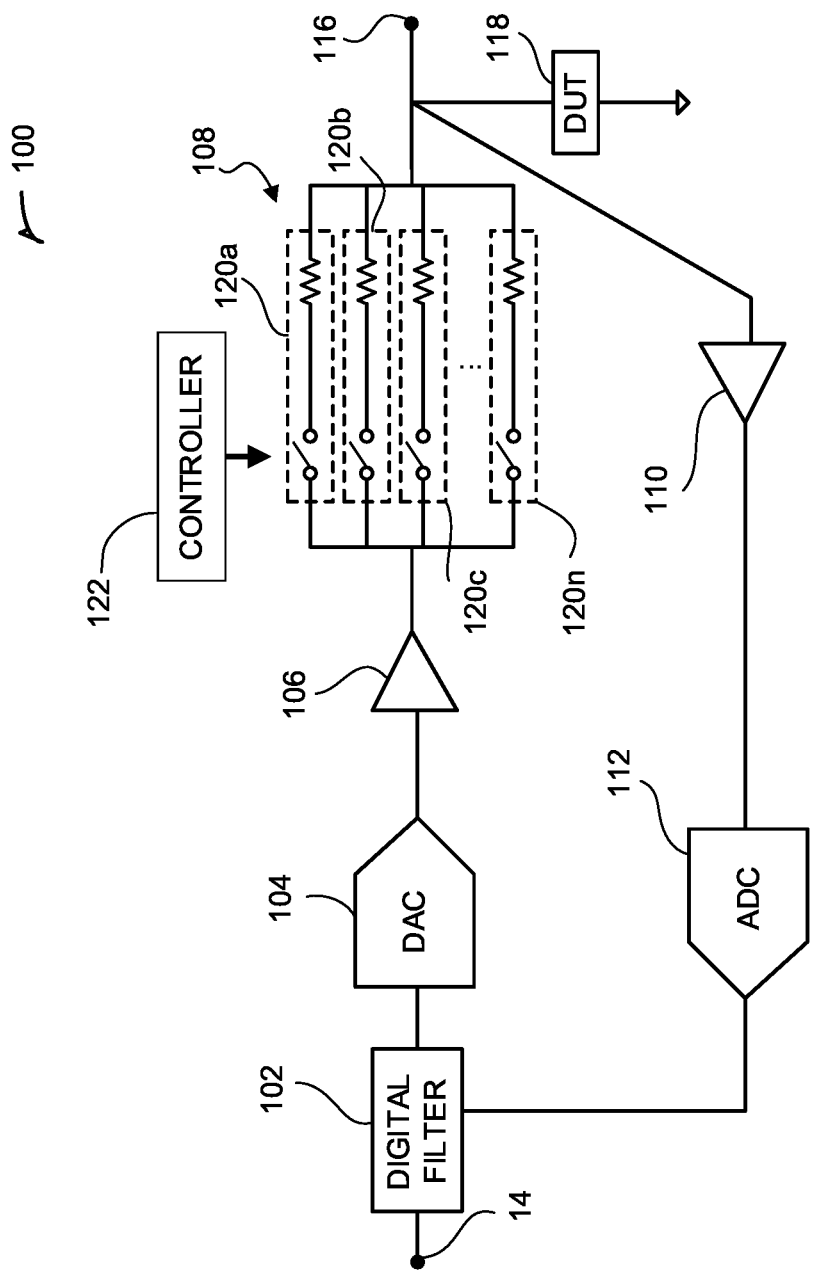
FIG. 1 is a circuit diagram illustrating an example control loop for automated test equipment (ATE).

FIG. 1 illustrates an example control loop 100 for an ATE system. The control loop 100 includes a digital filter 102, a digital-to-analog converter (DAC) 104, an amplifier 106, a sense array 108, an amplifier 110, and an analog-to-digital converter 112. The control loop receives input 114 to the digital filter 102 and provides an output 116 to a device-under-test (DUT) 118. The sense array 108 includes branch circuits 120a-120n. Each branch circuit 120a-120n includes a sense resistor and is configured to provide a desired current range for the DUT 108. The sense array 108 can include any number of branch circuits 120a-120n such as, for example, seven branch circuits. A controller 122 may be used to control the respective switches of each of the branch circuits 120a-120n to control the current range provided for the DUT 118. The controller 122 may include any analog circuitry, digital circuitry, or combination thereof, capable of providing control for the sense array 108.

The control loop 100 may include a FORCE path and a MEASURE path. The FORCE path includes the DAC 104, the amplifier 106, and the sense array 108. The MEASURE path includes the amplifier 110, which may be implemented as a measure-voltage instrumentation amplifier, for example, and the ADC 112. The digital filter 102 receives a digital input through the input 114. The digital filter 102 may be configured to compare the digital input value from the input 114 to the output of the ADC 112. The output of the digital filter 102, which may be an error value (a difference between an output voltage on the output 116 and a desired output voltage), is provided to the DAC 104, thereby closing the control loop 100 to correct the output voltage on the output 116.

In some systems that employ the control loop 100, such as ATE measurement systems, it may be highly desirable that switching within the current sense array 108 be handled such that only small voltage glitches appear at the output 116. In an example, the control loop 100 could start with a branch circuit 120a-120n that provides a current range up to 100 μA. For this range, when providing a full-scale current of 100 μA to the DUT 118, there may be a 200 mV drop across the sense array 108. Then, the controller 122 may begin the process of switching into the current sense range that allows up to 1 mA (which may be one step up from the 100 μA range). In this example, closing of the 1 mA range branch circuit switch may decrease the voltage drop across the sense array from 200 mV to about 20 mV, since the 1 mA current range impedance (switch plus sense resistor) may be about 1/10 that of the 100 μA current range impedance. Therefore, a 180 mV glitch could appear at the output 116, before the control loop 100 is able to respond and settle to the original value. In another example, when switching from the 1 mA range to the 100 μA range, for example, the 1 mA range is initially conducting. Then, the 100 μA range may be closed while the 1 mA range is still conducting. Following closing of the 100 μA range, the 1 mA range is opened, which may cause a sudden increase in the voltage drop across the sense array 108, creating an undesirable voltage glitch at the output 116. It is desirable to limit these glitches when switching between respective branch circuits 120a-120n.

Figure 2:
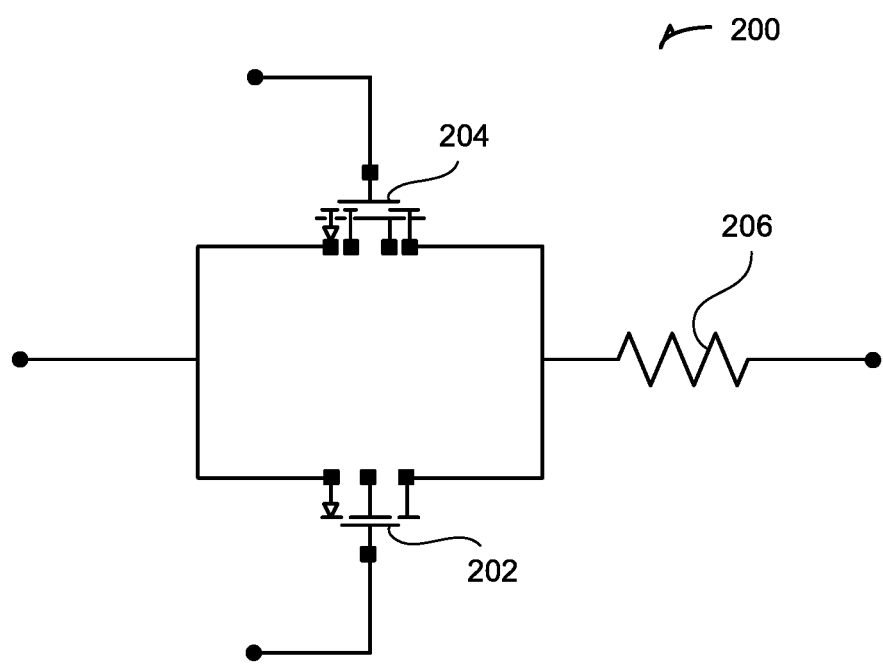
FIG. 2 is a circuit diagram illustrating an example branch circuit of a sense array of an ATE circuit.

FIG. 2 is a circuit diagram illustrating a conventional branch circuit 200 that may be used for a branch circuit 120a-120n of the sense array 108 that is configured to provide a lowest range of current. The conventional branch circuit 200 may include a p-type metal-oxide-semiconductor field-effect transistor (MOSFET) 202, an n-type MOSFET 204, and a sense resistor 206. The branch circuit 200 may be utilized by the sense array 108 for the branch circuit 120a-120n that provides the lowest current range for the DUT 118. Because the branch circuit 120a-120n that provides the lowest current range has the greatest impedance, switching into or out of the respective branch circuit 120a-120n would not generate a large voltage glitch because connecting or disconnecting the respective branch circuit 120a-120n would not create a large change in voltage drop across the sense array 108. Thus, a directly controlled conventional switch as illustrated in the branch circuit 200 may be used. To control the switch of the branch circuit 200, the gates of the n-type MOSFET 202 and the p-type MOSFET 204 can be connected to either supply rail. In other example, any other form of a switch may be implemented for the respective branch circuit 120a-120n that is configured to provide the lowest magnitude of current.

Figure 3:
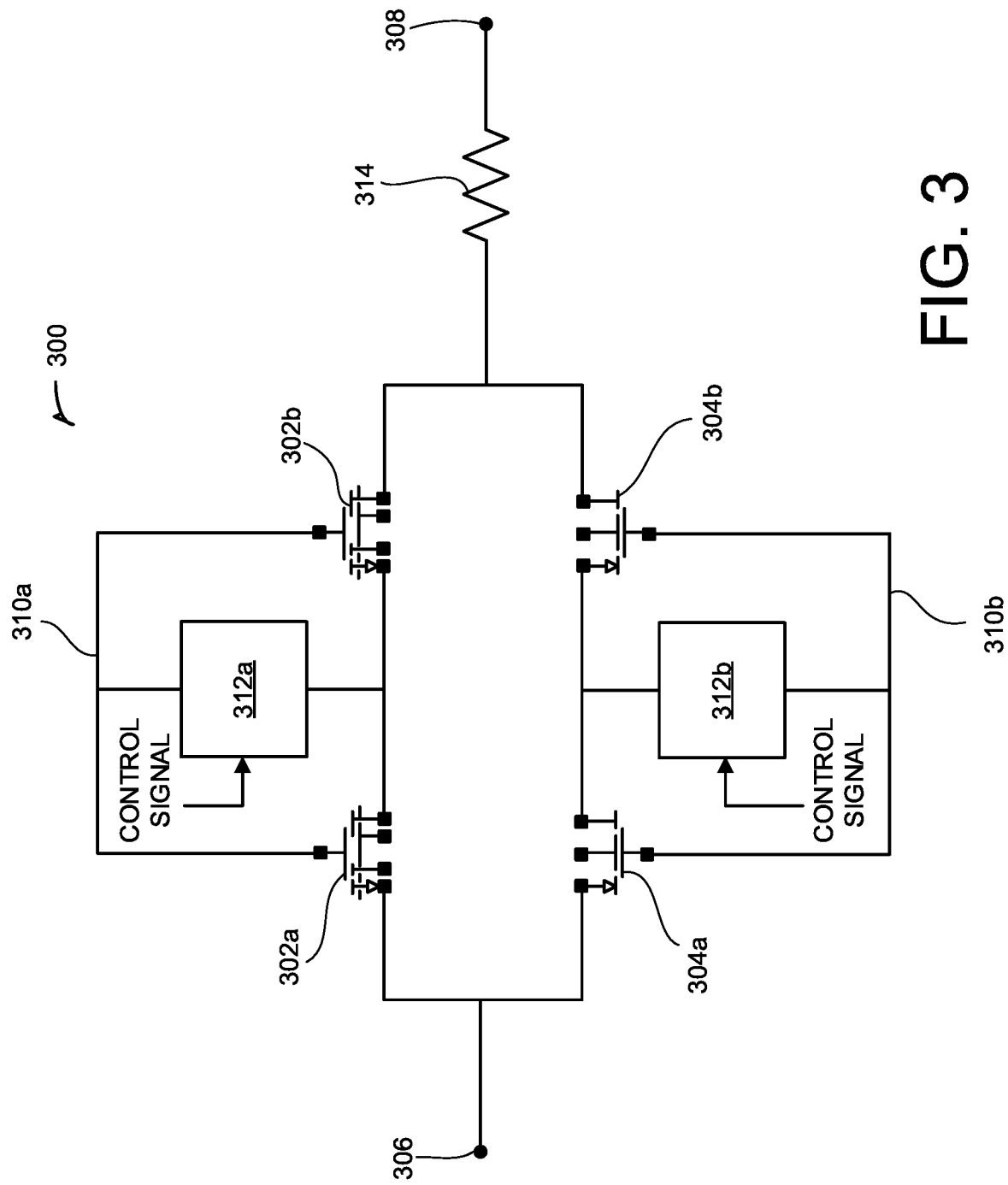
FIG. 3 is a circuit diagram illustrating an example branch circuit of a sense array of an ATE circuit.

FIG. 3 is a circuit diagram illustrating an example branch circuit 300 that may be utilized for any of the branch circuits 120a-120n of the sense array 108. Each switch includes two n-type MOSFETS (NMOS devices) 302a and 302b, and two p-type MOSFETS (PMOS devices) 304a and 304b. In an example, assuming the branch circuit 120a-120n one step down is already conducting (e.g., the 100 μA range branch circuit), the switch for the branch circuit 300 (e.g., the 1 mA range branch circuit) has to be closed in such a way that the total impedance between the input node 306 and the output node 308 (which are the input and output nodes of the entire sense array 108) changes substantially linearly in response to a linear control variable. To accomplish this, the control voltage on lines 310a and 310b provided to the gates of the NMOS devices 302a and 302b and the PMOS devices 304a and 304b, respectively, is servoed to the correct voltage by the variable impedance control circuits 312a and 312b, rather than being driven directly. The branch circuit 300 also includes the respective sense resistor 314.

The voltage on line 310a is generated by the variable impedance control circuit 312a based on a control signal. The control signal can be varied linearly to linearly control the impedance between the input 306 and the output 308 (the impedance across the sense array 108). While the control signal is varied linearly, the voltage on line 310a does not vary linearly, but rather varies so-as to vary the impedance across the sense array 108 substantially linearly. The gate voltage on line 310a is generated automatically by the variable impedance control circuit 312a using the control signal in order to accomplish the substantially linear change in impedance across the sense array that includes the branch circuit 300. The same operation may be achieved by the variable impedance control circuit 312b for the PMOS devices 304a and 304b.

Controlling the impedance using the impedance control circuits 312a and 312b may be used for both switching into, and switching out of, the branch circuit 300. For example, when switching into the branch circuit 300 from a lower current range branch circuit, the control signal provided to the variable impedance control circuits 312a and 312b may be linearly controlled to linearly increase the impedance across the sense array to prevent voltage glitches. When switching out of the branch circuit 300 into a lower current range branch circuit, the control signal provided to the variable impedance control circuits 312a and 312b may be linearly controlled to linearly decrease the impedance across the sense array to prevent voltage glitches.

Figure 4:
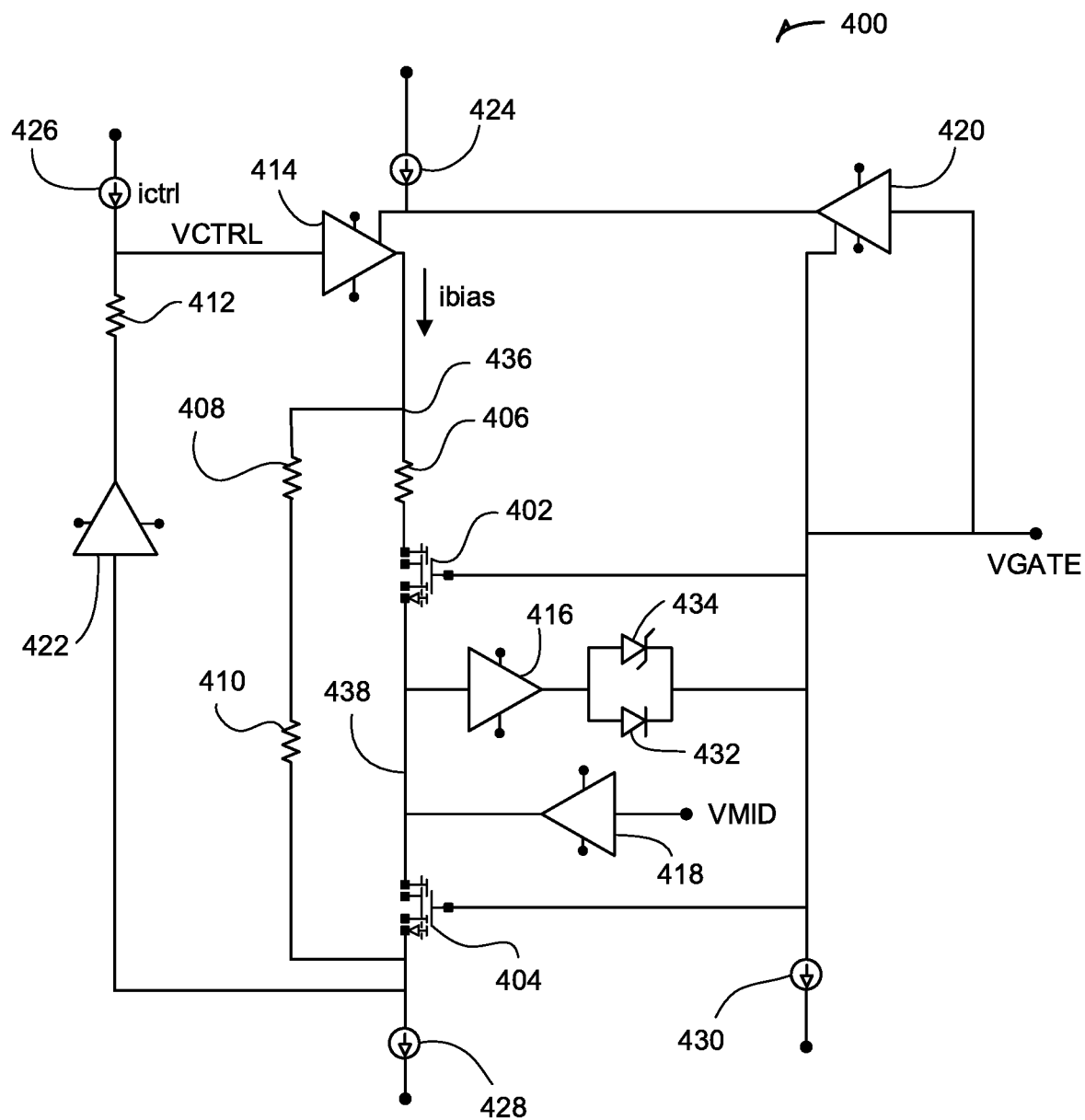
FIG. 4 is a circuit diagram illustrating an example variable impedance control circuit for use in a branch circuit of a sense array of an ATE circuit.

FIG. 4 is a circuit diagram illustrating an example variable impedance control circuit 400. The variable impedance control circuit 400 includes NMOS devices 402 and 404, resistors 406, 408, 410, and 412, buffers 414, 416, 418, 420 and 422, current sources 424, 426, 428, and 430, diode 432, and Zener diode 434. The variable impedance circuit 400 may be used for the variable impedance control circuit 312a of FIG. 3, for example. A similar circuit may be used for the variable impedance control circuit 312b of FIG. 3, but with PMOS devices in place of the NMOS devices 402 and 404.

The NMOS devices 402 and 404 receive a bias current (ibias) from the current source 424, a portion of which is impressed into the drain of the NMOS 402 through the resistor 406. In a similar manner to a diode-connected device, the voltage VGATE servos itself to a correct voltage for the gates of the NMOS devices 402 and 404 to support the drain current. Because current cannot flow into the gates of the NMOS devices 402 and 404, the entirety of the ibias current flows into the parallel paths that include the resistors 406, 408, and 410 and the NMOS devices 402 and 404. The buffer 414 receives the current at a low-impedance output and delivers it against the current source 424 at a high-impedance output. A voltage VCTRL can be varied to set the voltage at node 436. Therefore, a large-signal output impedance at the node 436 can be determined as Z=VCTRL/ibias. This holds true regardless of whether the NMOS devices 402 and 404 are operating in saturation or triode mode.

The impedance at the node 436 is equal to VCTRL/ibias regardless of the position and size of the resistors 406, 408, and 410, and regardless of the number of NMOS devices. Thus, the voltage VCTRL can be controlled to directly control the impedance at the node 436. The resistors 406, 408, and 410, and the NMOS devices 402 and 404 can be selected to replicate two respective branch circuits (e.g., the 100 µA branch circuit and the 1 mA branch circuit) of a sense array. Therefore, the voltage VGATE servos itself to a gate voltage that supports the impedance VCTRL/ibias. Because the resistors 406, 408, and 410, and the NMOS devices 402 and 404 replicate the respective branch circuits, the NMOS devices 312a and 312b can be controlled using VGATE to control the impedance of the sense array that includes the branch circuit 300 to be substantially similar to VCTRL/ibias. This way, VCTRL can be linearly controlled to substantially linearly control the impedance of the sense array that includes branch circuit 300.

In an example, the variable impedance control circuit 400 may be used as the variable impedance control circuit 312a and the branch circuit 300 may be switched into from the branch circuit 200. In this example, the resistor 406 may be sized to replicate the sense resistor 314, the resistor 408 may be sized to replicate an on-resistance of the NMOS device 204, and the resistor 410 may be sized to replicate the sense resistor 206. This way, the replicating loop that includes the resistors 406, 408, and 410 and the NMOS devices 402 and 404 replicate the resistance of the branch circuits 200 and 300. The replicated devices may be of a same resistance or a scaled resistance of the devices being replicated. Because of this, the servoed voltage VGATE can be used to control the gate voltages of the NMOS devices 312a and 312b to achieve the impedance VCTRL/ibias for the parallel circuit that includes the branch circuit 300 and the branch circuit 200. In other examples, if switching between two higher branch circuits (such that both branch circuits are implemented as branch circuits 300), the resistor 408 may be sized to replicate the on-resistance of both NMOS devices 312a and 312b, and the resistor 410 may be sized to replicate the resistor 314 of the branch circuit that is already conducting.

The circuit 400 is floated rather than tied to ground and is referred to VMID, which is the node between the drain and source of the NMOS devices 302a and 302b. In operation, the voltage VCTRL may be controlled to control the impedance of the sense array. In one example, VCTRL may be controlled by controlling the current source 426 (ictrl). When the replicating loop is regulating, there is current in the NMOS devices 402 and 404 (and in the resistor 406), as well as in the shunt resistors 408 and 410. A slight increase in current from the current source 426 leads to a slight increase in VCRTL, which leads to extra current through the shunt path resistors 408 and 410. This extra current is captured by the buffer 414 and delivered to the output of the buffer 420, which in turn delivers the extra current to the VGATE node. Consequently, the voltage VGATE drops (the extra current is sunk out of node VGATE). A decrease in the voltage VGATE de-biases the NMOS devices 402 and 404 so that the sum of the currents in the shunt path and in the NMOS devices 402 and 404 settles back to the original value, or ibias. If VCTRL continues to increase, the voltage VGATE continues to drop until it is clamped to a value of node 438 less the drop across the diode 432 by the buffer 416 and the diode 432.

Conversely, a slight decrease in the current from the current source 426 (ictrl) leads to sourcing a current into the node VGATE, which leads to an increase in the current through the NMOS devices 402 and 404. The replicating loop settles when the combined current in the shunt path and the NMOS path returns to the original value, or ibias. Further decrease in the current from the current source 426 (and VCTRL) leads to the voltage VGATE increasing until it is clamped to the reverse breakdown voltage of the Zener diode 434 above the node 438.

Therefore, the voltage VGATE is the correct voltage to make the combined impedance of the shunt path (resistors 408 and 410) and the NMOS path (NMOS devices 402 and 404 and the resistor 406) proportional to the current from the current source 426 or the voltage VCTRL, and equal to Z=VCTRL/Ibias. At one extreme, the impedance of the replicating loop is equal to the series combination of the resistors 408 and 410 (the NMOS devices 402 and 404 are off), and at the other extreme is about equal to the on resistance of the series combination of the resistor 406 and the two NMOS devices 402 and 404 (when the NMOS devices 402 and 404 are on).

Figure 5A:
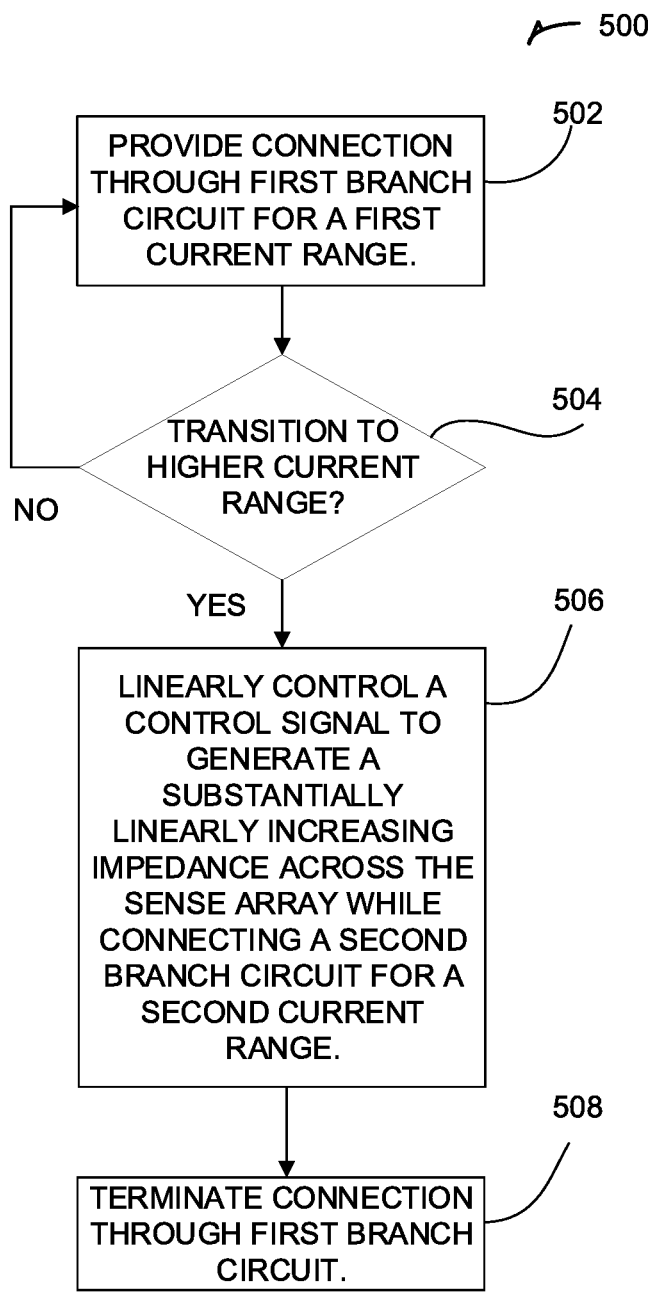
FIGS. 5A and 5B are flowcharts illustrating methods of switching between sense array branch circuits to minimize voltage glitching.

FIG. 5A is a flowchart illustrating a method 500 of switching from a branch circuit into a higher current range branch circuit. At step 502, one or more transistors of a first branch circuit are being controlled to connect an input of the sense array to a load through the first branch circuit. This branch circuit may provide a current range up to 100 µA, for example, or any other desirable current range. The method waits at step 504 until switching to a higher current range. For example, a test circuit may include a sense array that includes several branch circuits. Each branch circuit may include a sense resistor and a corresponding switch circuit. Each branch circuit may provide a current range that is greater than a branch circuit one step below. In one example, each branch circuit may provide a current range with a maximum current 10 times the magnitude of the branch circuit one step below. At step 506, the circuit is controlled to begin switching into a second branch circuit one step above the first branch circuit. For example, switching from the 100 µA branch circuit to the 1 mA branch circuit.

To switch into the second branch circuit, a control signal is varied to control a respective variable impedance control circuit of the second branch circuit. The control signal may be a control voltage or a control current, for example. The variable impedance control circuit is configured to generate gate voltages for MOSFET devices of the second branch circuit to linearly decrease the impedance of the sense array based on a linear variation of the control signal. In this example, this may include controlling the control signal to linearly decrease the impedance of the sense array. At step 508, once the impedance across the sense array has reached a desired value, the switch of the lower branch circuit can be opened. The switch of the lower branch circuit may be opened using a variable impedance control circuit, or may be directly controlled to disconnect the input from the load through the lower branch circuit.

Figure 5B:
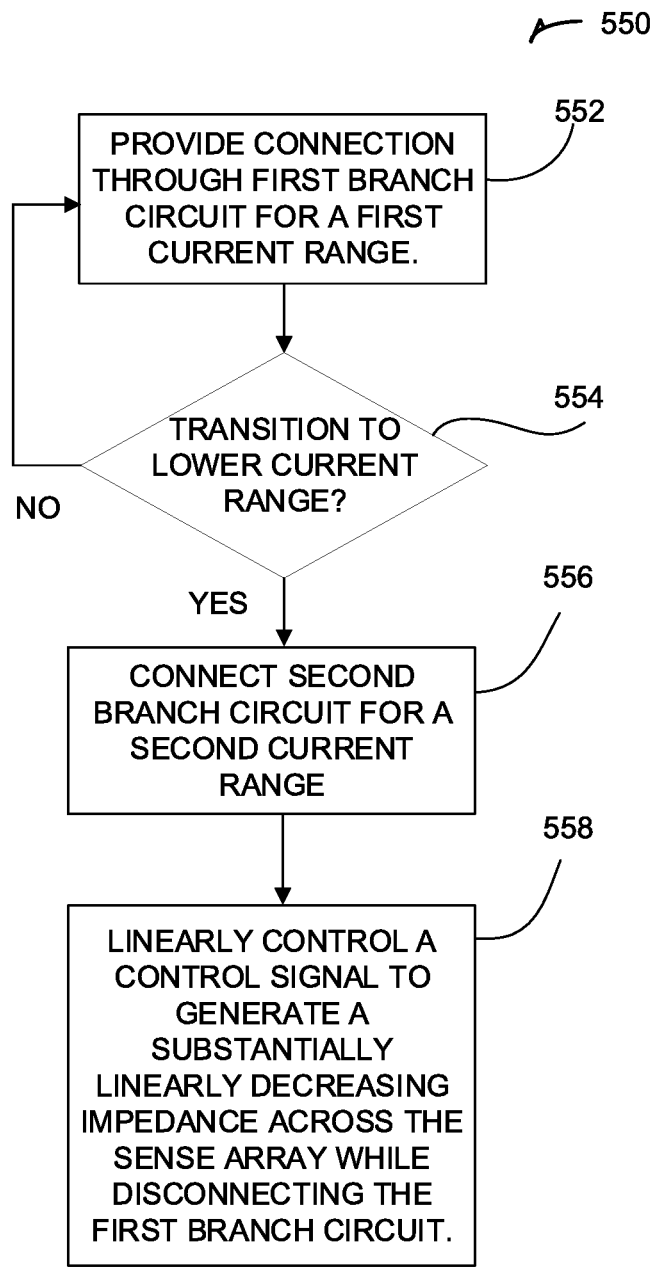

FIG. 5B is a flowchart illustrating a method 550 of switching from a branch circuit into a lower current range branch circuit. At step 552, one or more transistors of a first branch circuit are controlled to connect the input of the sense array to a load through a first branch circuit. The first branch circuit may provide a current range up to 1 mA, for example, or any other desirable current range. The method waits at step 554 until switching to a lower current range. At step 556, the circuit is controlled to begin switching into a second branch circuit one step below the first branch circuit. For example, switching from the 1 mA branch circuit to the 100 µA branch circuit. This may include directly controlling the switch of the second branch circuit to close the switch and connect the input of the sense array to the load through the second branch circuit, or using a variable impedance control circuit to close the switch.

At step 558, once the second branch circuit is conducting, the input to the sense array is disconnected from the load through the first branch circuit. To open the first branch circuit, a control signal is varied to control a respective variable impedance control circuit of the second branch circuit. The control signal may be a control voltage or a control current, for example. The variable impedance control circuit is configured to generate gate voltages for MOSFET devices of the second branch circuit to linearly increase the impedance of the sense array based on a linear variation of the control signal. In this example, this may include linearly varying the control signal to linearly increase the impedance of the sense array. This way, voltage glitches created by switching out of higher branch circuits can be reduced.

Figure 6A:
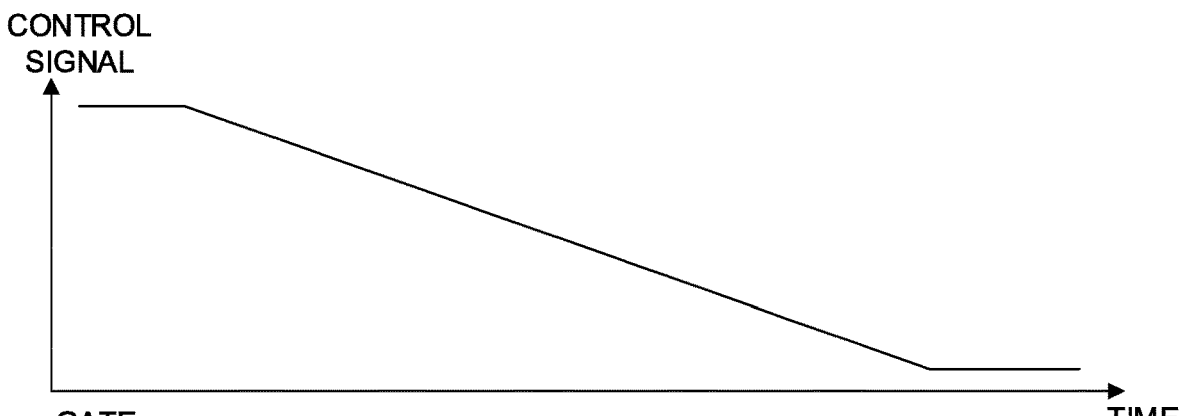
FIGS. 6A-6D are charts illustrating control and output signals for branch circuits of a sense array of an ATE circuit.

FIGS. 6A-6D are a signal diagrams illustrating signals for switching on a branch circuit, such as the branch circuit 300. FIG. 6A illustrates a control signal, such as the current from the current source 426 (ictrl). As illustrated in FIG. 6A, when turning on a respective branch circuit, ictrl can be linearly decreased from a first value to a second value. The rate at which ictrl is decreased can be selected based on the circuit. For example, the rate of control of ictrl may be based on a response rate of the control loop 100, for example.

Figure 6B:
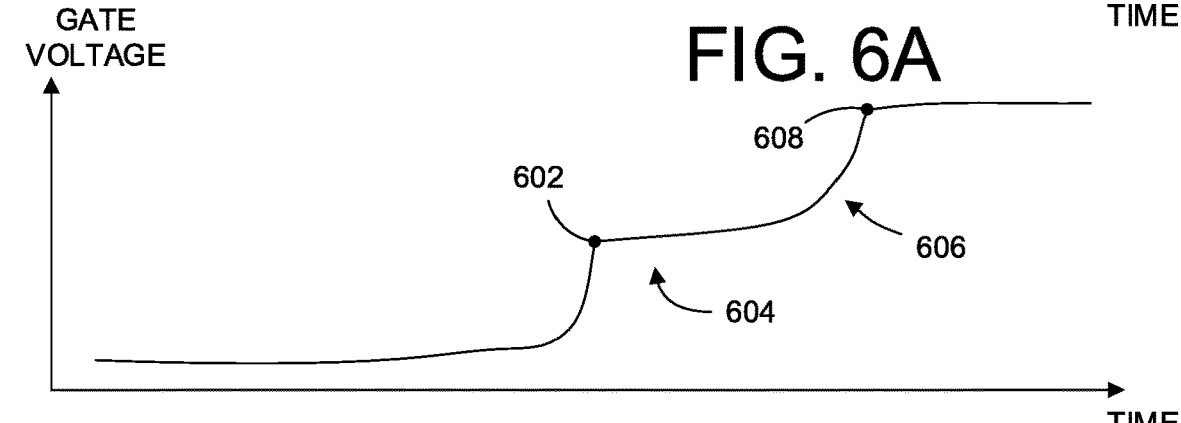

FIG. 6B illustrates a voltage VGATE provided to the gates of the NMOS devices 302a and 302b by the variable impedance control circuit 400. The control signal illustrated in FIG. 6A is provided to control the variable impedance control circuit 400. The respective switch starts out in the off state (low or negative voltage). VGATE then rises quickly to a voltage 602 (which may be approximately 2V) when the NMOS devices begin to conduct, at which point the loop of the variable impedance control circuit begins to regulate. Following the quick increase to the voltage 602, VGATE increases slowly during a first time 604 and then rises quickly during a second time 606 to a final value 608 (which may be 6V, for example). The shallow region during the first time 604 is indicative of NMOS devices incrementally turning on fast at the onset of conduction, and hence VGATE must vary slowly to realize a total linearly-changing impedance of the sense array. Similarly, the steep region during the time 606 is indicative of the NMOS devices incrementally turning on slowly when the devices are well into their conduction region, and hence VGATE undergoes a sharp change to realize a total linearly-changing impedance. Finally, VGATE is clamped at the Zener voltage.

Figure 6C:
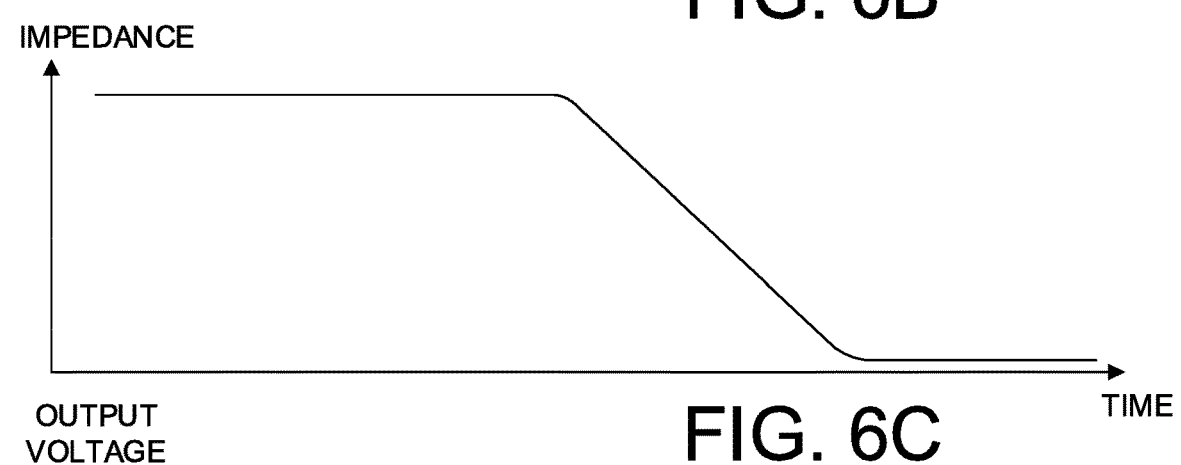
Figure 6D:
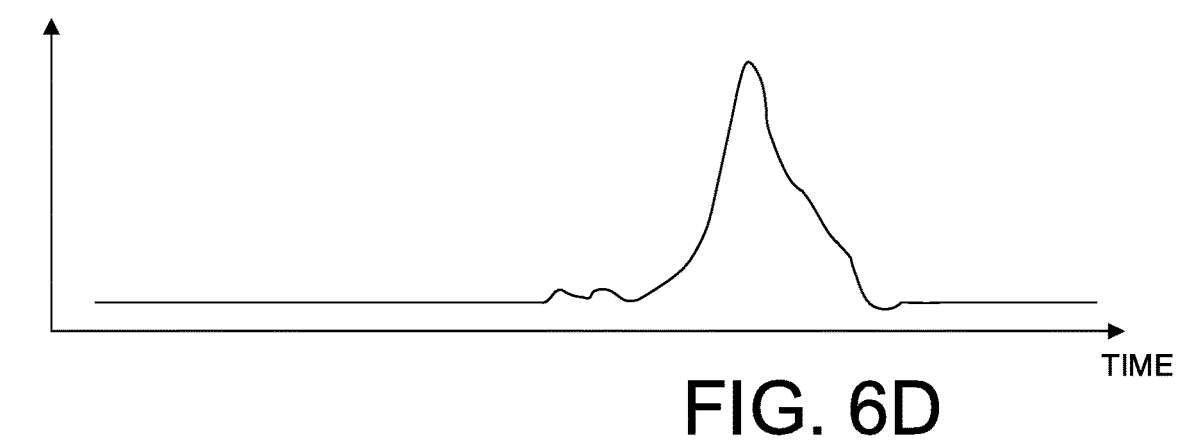

FIG. 6C illustrates a total impedance of the sense array 108 when switching from a first conducting branch circuit (e.g., 120n) into a second branch circuit (e.g., 120c). While illustrated as a linear decrease from a first impedance value to a second impedance value, in some examples, the decrease in impedance may begin in a non-linear fashion, prior to decreasing in a substantially linear manner. This non-linear region may be a result of building in a fixed offset between the voltage VGATE and the actual voltage applied to the NMOS devices 302a and 302b, for example. This offset may be used to prevent any overshoot in the voltage VGATE from temporarily getting the NMOS devices 302a and 302b past the onset of conduction during turn-on, resulting in possible output glitches. FIG. 6D illustrates a voltage at the output 116 to the DUT 118. In some examples, the magnitude of the glitch illustrated in FIG. 6D may be approximately 14 mV, greatly reduced from the nearly 200 mV glitches that may appear in conventional systems.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method of controlling current-range switching to limit ditching when switching between different current ranges, the method comprising:
   controlling at least one first transistor of a first branch circuit of a sense array to connect an input of the sense array to a load through the first branch circuit;
   varying a control signal to vary a control voltage provided to a voltage buffer of a variable impedance control circuit;
   providing an output of the voltage buffer to a gate of at least one replica transistor, wherein a gate voltage of the gate of the at least one replica transistor servos itself to a value that supports a bias current;
   providing the gate voltage of the at least one replica transistor as a gate voltage of at least one second transistor of a second branch circuit parallel to the first branch circuit of the sense array to establish an impedance of the sense array between the input and the load that is proportional to the control signal, including controlling the such that an impedance of the sense array decreases from a first value to a second value when connecting the load to the input through the second branch circuit; and
   controlling the at least one first transistor of the first branch circuit of the sense array to disconnect the input from the load through the first branch circuit after the impedance of the sense array has reached the second value.

2. The method of claim 1, wherein varying the control signal comprises varying a control current linearly to decrease the impedance of the sense array from the first value to the second value linearly.

3. The method of claim 2, wherein varying the control signal comprises varying the control current to vary the control voltage provided to the voltage buffer of the variable impedance control circuit.

4. The method of claim 3, wherein the at least one second transistor comprises first and second control transistors, and wherein the at least one replica transistor comprises first and second replica transistors, and wherein varying the control signal to generate the gate voltage of the at least one second transistor of the second branch circuit further comprises:
   clamping a midpoint connected between a drain of the first replica transistor and a source of the second replica transistor to a midpoint connected between a drain of the first control transistor and a source of the second control transistor.

5. The method of claim 3, wherein:
   the first branch circuit comprises a first sense resistor and the second branch circuit comprises a second sense resistor,
   the variable impedance control circuit comprises a first replica sense resistor connected in series with the at least one replica transistor and second and third replica resistors connected in parallel with the first replica resistor and the at least one replica transistor, and
   the first replica sense resistor has a scaled resistor corresponding to the second sense resistor.

6. The method of claim 5, wherein the second replica resistor has a scaled resistance corresponding to the first sense resistor, and wherein the third replica resistor has a scaled resistance corresponding to an on-resistance of the at least one first transistor.

7. The method of claim 6, wherein controlling the at least one first transistor of the first branch circuit of the sense array to disconnect the input from the load through the first branch circuit after the impedance of the sense array has reached the second value comprises directly controlling the at least one first transistor to disconnect the input from the load through the first branch circuit.

8. A method of controlling current-range switching to limit glitching when switching between different current ranges, the method comprising:
   controlling at least one first transistor of a first branch circuit of a sense array to connect an input of the sense array to a load through the first branch circuit;
   controlling at least one second transistor of a second branch circuit of the sense array to connect the input to the load through the second branch circuit;
   varying a control signal to vary a control voltage provided to a voltage buffer of a variable impedance control circuit;
   providing an output of the voltage buffer to a gate of at least one replica transistor, wherein a gate voltage of the gate of the at least one replica transistor servos itself to a value that supports a bias current; and
   providing the gate voltage of the at least one replica transistor as a gate voltage of the at least one first transistor of the first branch circuit to establish an impedance of the sense array between the input and the load that is proportional to the control signal such that an impedance of the sense array increases from a first value to a second value when disconnecting the input from the load through first branch circuit.

9. The method of claim 8, wherein varying the control signal comprises varying a control current linearly to increase the impedance of the sense array from the first value to the second value linearly.

10. The method of claim 9, wherein varying the control signal comprises varying the control current to vary the control voltage provided to WI the voltage buffer of the variable impedance control circuit.

11. The method of claim 10, wherein the at least one first transistor comprises first and second control transistors, and wherein the at least one replica transistor comprises first and second replica transistors, and wherein varying the control signal to generate the gate voltage of the at least one first transistor of the first branch circuit further comprises:
clamping a midpoint connected between a drain of the first replica transistor and a source of the second replica transistor to a midpoint connected between a drain of the first control transistor and a source of the second control transistor.

12. The method of claim 10, wherein:
the first branch circuit comprises a first sense resistor and the second branch circuit comprises a second sense resistor,
the variable impedance control circuit comprises a first replica sense resistor connected in series with the at least one replica transistor and second and third replica resistors connected in parallel with the first replica resistor and the at least one replica transistor, and
the first replica resistor has a scaled resistance corresponding to the first sense resistor.

13. The method of claim 12, wherein the second replica resistor has a scaled resistance corresponding to the second sense resistor, and wherein the third replica resistor has a scaled resistance corresponding to an on-resistance of the at least one second transistor.

14. The method of claim 13, wherein controlling the at least one second transistor of the second branch circuit of the sense array to connect the input to the load through the second branch circuit comprises directly controlling the at least one second transistor to connect the input to the load through the second branch circuit.

15. A system for controlling current-range switching to limit glitching, the system comprising:
a sense array connected between an input and a load, the sense array comprising:
a first branch circuit connected between the input and the load; and
a second branch circuit connected between the input and the load and in parallel with the first branch circuit, wherein the first branch circuit comprises:
at least one first transistor;
a first sense resistor; and
a variable impedance control circuit configured to receive a control signal and generate a gate voltage of the at least one first transistor, the variable impedance control circuit comprising:
a voltage buffer configured to receive the control signal and a bias current, and
at least one replica transistor, wherein a gate of the at least one replica transistor is connected to receive an output of the voltage buffer such that the at least one replica transistor servos itself to a value that supports the bias current;
wherein the gate voltage of the at least one replica transistor is provided as the gate voltage of the at least one first transistor to establish an impedance of the sense array between the input and the load that is proportional to the control signal such that an impedance of the sense array transitions from a first value to a second value when connecting or disconnecting the first branch circuit between the input and the load while the input is connected to the load through the second branch circuit.

16. The system of claim 15, wherein the variable impedance control circuit is configured to increase the impedance from the first value to the second value when disconnecting the first branch circuit between the input and the load.

17. The system of claim 15, wherein the variable impedance control circuit is configured to decrease the impedance from the first value to the second value when connecting the first branch circuit between the input and the load.

18. The system of claim 15, wherein the variable impedance control circuit is configured to vary the impedance of the sense array from the first value to the second value linearly in response to the control signal varying linearly.

19. The system of claim 15, wherein the voltage buffer is configured to receive a control voltage as the control signal, the control voltage directly proportional to the control signal, and wherein a drain of the at least one replica transistor is configured to receive the bias current.

20. The system of claim 19, wherein the second branch circuit comprises at least one second transistor and a second sense resistor, and wherein the variable impedance control circuit further comprises:
a first replica sense resistor connected in series with the at least one replica transistor; and
second and third replica resistors connected in parallel with the first replica resistor and the at least one replica transistor;
wherein the first replica resistor has a scaled resistance corresponding to the first sense resistor; and
wherein the second replica resistor has a scaled resistance corresponding to the second sense resistor; and
wherein the third replica resistor has a scaled resistance corresponding to an on-resistance of the at least one first transistor.

* * * * *